United States Patent [19]

Ogawa

[11] Patent Number: 4,616,343
[45] Date of Patent: Oct. 7, 1986

[54] SEMICONDUCTOR MEMORY DEVICE
[75] Inventor: Junji Ogawa, Tokyo, Japan
[73] Assignee: Fujitsu Limited, Kawasaki, Japan
[21] Appl. No.: 788,049
[22] Filed: Oct. 16, 1985
[30] Foreign Application Priority Data Oct. 16, 1984 [JP]   Japan ................... 59-216786

[51] Int. Cl.<sup>4</sup> ............... G11C 11/40; G11C 13/00
[52] U.S. Cl. .................... 365/203; 365/219; 365/238
[58] Field of Search ........... 365/189, 230, 203, 205, 365/219, 220, 221, 238

[56] References Cited
U.S. PATENT DOCUMENTS
4,402,067  8/1983  Moss et al. ................. 365/219

Primary Examiner—Terrell W. Fears
Attorney, Agent, or Firm—Staas & Halsey

[57] ABSTRACT

A semiconductor memory device including a random access memory cell array, a series/parallel data transfer circuit, transfer gate, an active pull-up circuit, and an active pull-down circuit. The transfer gate is inserted between bit lines of the random access memory cell array and the series/parallel data transfer circuit to carry out parallel transfer of data. Output data of the series/parallel data transfer circuit is simultaneously written in a group of memory cells of selected work lines by turning on the transfer gate and selection of a word line. When data of each output of steps of the series/parallel data transfer circuit is logic "1", the active pull-up circuit charges up a selected bit line of the random access memory cell array. When data of each output of steps of the series/parallel data transfer circuit is logic "0", the active pull-down circuit discharges a selected bit line of the random access memory cell array. One or more of the active pull-up and active pull-down circuits is arranged in the semiconductor memory device.

2 Claims, 12 Drawing Figures

SEMICONDUCTOR MEMORY DEVICE

BACKGROUND OF THE INVENTION

1. Field of the Invention

The present invention relates to a semiconductor memory device having, in addition to a random-access memory (RAM) portion, a shift register for performing parallel data transfer for read/write operations with respect to the RAM portion. The device according to the present invention is directed to ensuring reliable write-in of data into the RAM portion from the shift register without special changes in the RAM portion.

2. Description of the Related Art

A RAM with a shift register which can transfer in parallel the data of one word line of the RAM cell array has been used as a video RAM. In such a RAM device, there are provided a RAM cell array, a shift register, transfer gates controlled by clock signal, bit lines, word lines, sense amplifiers, and dummy cells for data transfer in parallel.

In such a RAM device, when the selection of the word line WL and the opening of the transfer gate are carried out simultaneously, a pair of bit lines simultaneously are given a potential difference by means of the selection of the word line and are given a potential difference by means of the opening of the transfer gate. In this case, there is no particular problem when both work in the same direction (that is, the same polarity), but the cancel each other when they are of opposite polarities. The behavior of the pair of bit lines after the rise of the potential of word line and transfer gate control signal differ depending on the write data and the stored data of the selected cell. Of course, once a write operation is to be carried out, the level definition of bit lines by the data of the shift register must take precedence. For this reason, the capacity of the shift register and dummy cell must be sufficiently large compared to the capacity of both the real cells of the RAM and the dummy cells.

When the potential of the word line is raised simultaneously with a transfer gate control signal, however, the cause of the slight potential difference in the pair of bit lines is not only the output of the shift register and the dummy cell, but also the real cells in the RAM and the dummy cells. Therefore, write-in from the shift register into the real cells cannot be carried out unless the capacity of the output node of the shift register is larger than that of the real cells. To achieve high speed operation of the shift register and low power consumption, it is necessary for the capacity of the output node of the shift register to be smaller. Under these circumstances, it is very difficult to carry out an appropriate writing.

When the voltage difference established for the bit lines by the selected cell and that the data of the shift register are opposite in polarity, for example, if the former lowers the potential of a second bit line and the latter lowers the potential of a first bit line, then both potentials of the first and second bit lines are lowered. Then, because the capacities of the shift register side and dummy cell side increase, even if the function of the former is made relatively weaker, the level drop of the bit lines on the H side is remarkably large, so erroneous writing may occur. In the prior art, a device for enabling more accurate writing from the shift register to the RAM portion has been sought for.

SUMMARY OF THE INVENTION

It is an object of the present invention to provide a semiconductor memory device enabling greater accuracy of writing from a shift register to a RAM portion.

According to one aspect of the invention, there is provided a semiconductor memory device including: a RAM cell array including a plurality of memory cells, word lines, and bit lines, each of said memory cell being connected to one of said word lines and to one of said bit lines; series/parallel data transfer means capable of parallel transfer of data of one word line amount of the RAM as well as series transfer of the data of one word line amount, the series/parallel data transfer means having a plurality of stages; transfer gate means inserted between bit lines of the RAM cell array and the series/parallel data transfer means for carrying out parallel transfer of data, parallel output data from the stages of the series/parallel data transfer means being simultaneously written in a group of memory cells of selected word lines of the RAM cell array by turning-on of the transfer gate means and selection of a word line; and a plurality of active pull-up circuit means, operatively connected to said bit lines and to receive said parallel data, respectively, each for charging the associated bit line of said random access memory cell array when corresponding one of said parallel output data from the associated stage of said series/parallel data transfer means is logic "1".

BRIEF DESCRIPTION OF THE DRAWINGS

The present invention will be further clarified with reference to the ensuring description with reference to the accompanying drawings, in which.

DESCRIPTION OF THE PREFERRED EMBODIMENTS

Before describing the preferred embodiments, a description will be made of the related art for reference purposes.

Figure 1:
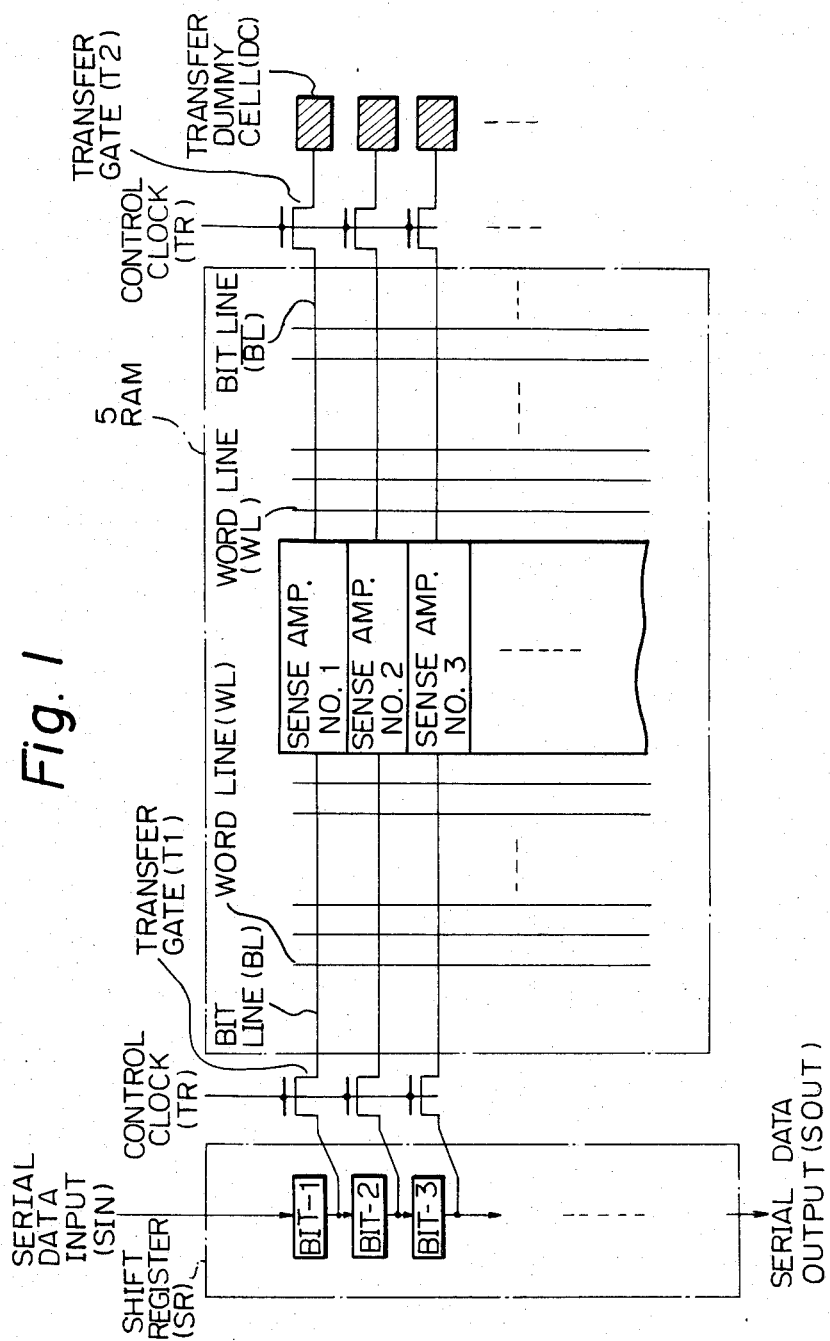
FIG. 1 is a schematic view of the general construction of a RAM cell array.

Known in the art are RAM's provided with a shift register which can transfer in a parallel mode data of an amount corresponding to one word line of a RAM cell array. These are used for video and other applications and have the constitution as shown in FIG. 1. The RAM 5 is provided with a shift register (SR) that can transfer data of one word line amount in a parallel mode into a cell array of an open bit line type dynamic RAM.

Figure 2:
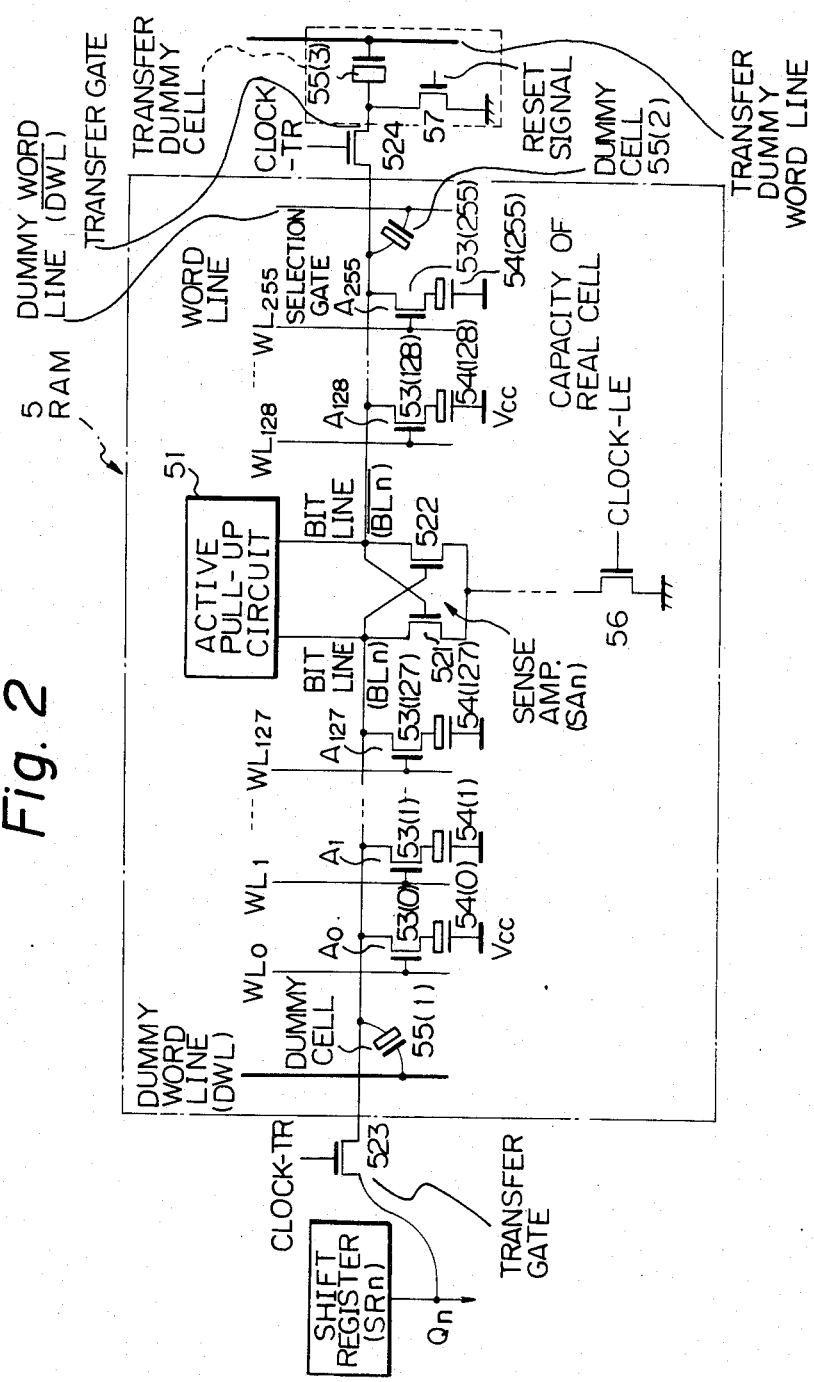
FIG. 2 is a partly schematic circuit diagram of the RAM in FIG. 1.

FIG. 2 is a detailed view of the RAM 5 in FIG. 1. In the figure, 521 and 522 denote metal-oxide semiconductor (MOS) transistors which constitute sense amplifiers SAn (n is any integer), 523 and 524 transistors for a transfer gate, 55(1) and 55(2) dummy cells in the RAM 5, DWL and $\overline{DWL}$ dummy word lines in the RAM 5, WL0 to WL255 word lines, BLn and $\overline{BLn}$ bit lines, 54(0) to 54(255) real cells, A0 to A255 selection gates, and SRn the n-th bit of a shift register.

This type of memory operates normally when the transfer gate is closed (in an OFF state) and the RAM cell array separated from the shift register SRn so that the RAM 5 operates independently. In reading, the bit line is precharged. After selecting the word line, the potentials of the bit lines are made different by the selected cell (real cell) and dummy cell. The sense amplifier SAn is made active to enlarge the difference, making one the H (high) level and the other the L (low) level. These are transmitted to the outside by data buses DB and $\overline{DB}$ (not shown). In writing, the write data is followed to make one of the data buses DB and $\overline{DB}$ the H level and the other the L level. These are transmitted to the selected bit lines BL and $\overline{BL}$ and further sent to the memory cell by the selected word line WL. The write and read operations are carried out in units of single memory cells.

As opposed to this, write and read operations from the shift register SRn are performed simultaneously for all memory cells on the selected word line. That is, in reading by precharging the bit lines, selecting the word line, and activating the sense amplifier, all the bit lines BL and $\overline{BL}$ become the high level or low level in accordance with the stored data of the group of memory cells on the above-described selected word line. Therefore, it is possible to open the transfer gate and enter the same into the stages of the shift register. Thereafter, when the transfer gate is closed and the shift of the shift register begun, the stored data of all the memory cells on the selected word line is taken out as serial output data SOUT.

In writing, as explained in more detail later, the write data is input into the shift register SRn in one word line amounts as a serial input data SIN. Then the transfer gate is opened and all the bit lines BL, $\overline{BL}$ given an H level or L level responsive to the data of the stages of the shift register SRn. A word line is selected and all the memory cells on the word line are given the potential of the bit lines, i.e., a write operation is performed.

Figure 3:
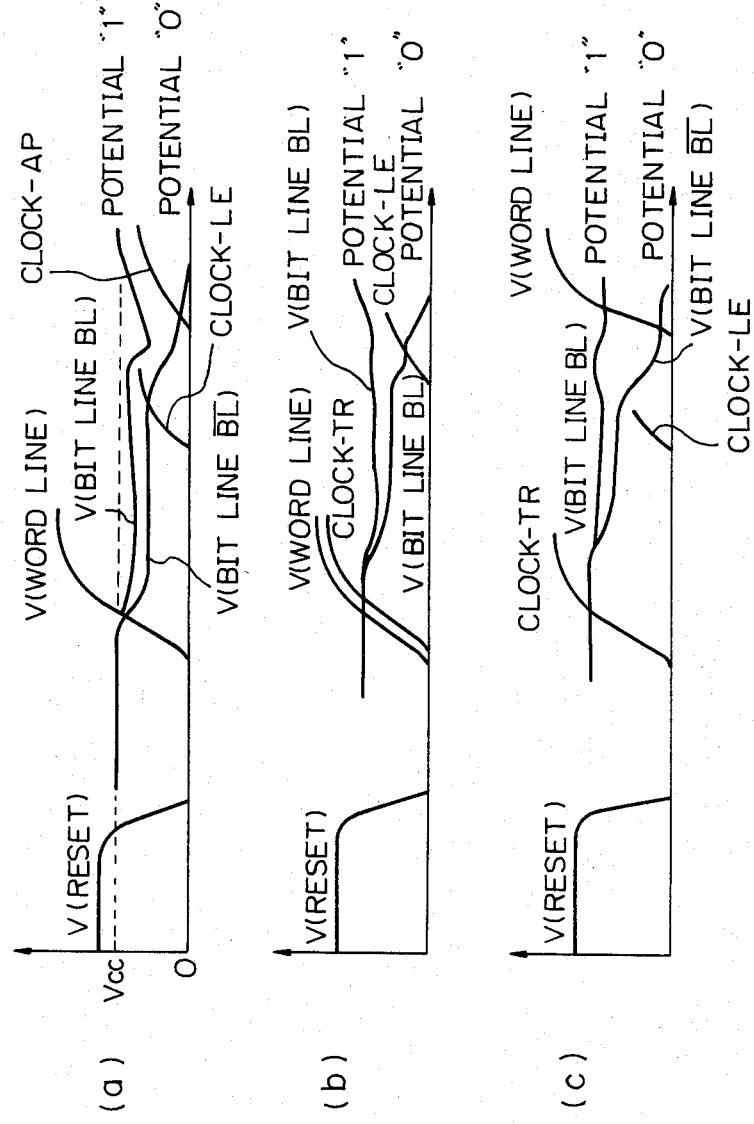
FIGS. 3(a) to (c) show waveforms of the operation of the RAM in FIG. 1.

In the open bit-line type RAM of FIG. 1, if the shift register SRn is connected to the bit line BLn side, as shown in FIG. 2, a dummy cell is connected to the opposite bit line $\overline{BLn}$ side, to give a potential difference to the bit lines BLn and $\overline{BLn}$ according to the information Qn of the shift register SRn and to write in the cells in the RAM. There are two write methods. In the first method, as shown in FIG. 3(b), the potentials of the word line signal V (word line) and transfer gate control signal CLOCK-TR are raised at the timing of memory access. In the second method, as shown in FIG. 3(c), first the potential of the transfer gate control signal CLOCK-TR is raised, then that of word line signal V (work line) is raised. In a usual read operation of a dynamic RAM, as shown in FIG. 3(a) for comparison purposes, precharging of the bit lines, etc., is carried out by a resetting signal V (reset). A word line is selected at the memory access timing and the potentials of the pair of bit lines BL and $\overline{BL}$ are caused to have a slight potential difference according to the cell information. Thereafter, the sense amplifier SAn is activated by a clock LE (refer to FIG. 2) to amplify the potential differences V (bit line BL) and V (bit line $\overline{BL}$) of BL and $\overline{BL}$.

In FIG. 3(a) the clock-AP portion denotes the pull-up state to the power supply $V_{CC}$ rising an active pull-up circuit which is attached to the sense amplifier. In FIGS. 3(b) and 3(c), the clock-AP is omitted. In this way, clearly, the bit line potential, set at the H level or L level, is fetched out by the data buses.

In writing into a RAM by means of data of the shift register SRn, a potential difference is given to the bit lines BL and $\overline{BL}$ in accordance with that data. This is because both the capacity of each stage of the shift register $SR_N$, set for charging or discharging by that data, and the dummy cell DC are connected to the bit lines BL and $\overline{BL}$.

Therefore, when the selection of the word line WL and the opening of the transfer gate are carried out simultaneously, the bit lines BL and $\overline{BL}$ simultaneously are given a potential difference by means of the selection of the word line and are given a potential difference by means of the opening of the transfer gate. In this case, there is no particular problem when both work in the same direction (that is, the same polarity), but they cancel each other when they are of opposite polarities.

FIG. 3(b) does not fully illustrate this point, but the behavior of the bit lines BL and $\overline{BL}$ after the rise of the signals V (word line) and clock-TR differ depending on the write data and the stored data of the selected cell. Of course, once a write operation is to be carried out, the level definition of bit lines by the data of the shift register must take precedence. For this reason, the capacity of the shift register SRn and dummy cell DC must be sufficiently large, compared to the capacity of both the real cells A1 to A255 of the RAM and the dummy cells 55(1) and 55(2).

In the FIG. 3(c) mode, the waveform of a transfer clock-TR is first raised to make the transfer gate 523 and 524 (FIG. 2) turn on. With the aid of data of the shift register, the bit lines BLn and $\overline{BLn}$ are given a potential difference.

Since the word line is selected at the stage where a sufficient potential difference is given to the bit lines by the sense operation, there is no problem with the provision of a potential difference in the bit lines by the stored data of the selected cell. There is also no problem with the increase of the capacity of the dummy cells, etc. As a result, a reliable write operation can be performed.

With this method, however, there is a need to raise the waveform of the word line V (word line) at a different timing from the memory operation, so there is the disadvantage of requiring control and lengthening the cycle time for transfer by the delay of the word line potential V (word line). Contrary to this, the system described in FIG. 3(b) selects the word line V (word line) simultaneously with the transfer clock $TR_N$ (as denoted by a clock-TR), so there is no need to significantly modify the RAM portion and complication of the control system can be avoided.

When the potential of the word line V (word line) is raised simultaneously with a transfer clock clock-TR as in FIG. 3(b), however, the cause of the slight potential difference in the bit lines BL, $\overline{BL}$, as described before, is not only the output Qn of the shift register SRn and the dummy cell DC, but also the real cells 54(0) to 54(255) in the RAM and the dummy cells 55(1) to 55(3). Therefore, write-in from the shift register SRn into the real cells 54(0) to 54(255) cannot be carried out unless the capacity of the output node of the shift register SRn is larger than that of the real cells. To achieve high speed serial operation of the shift register and low power consumption, it is necessary for the capacity of the output node of the shift register to be smaller. Under these circumstances, it is very difficult to carry out appropriate writing.

When the voltage difference established for the bit lines by the selected cell and that the data of the shift register are opposite in polarity, for example, if the former lowers V (bit line $\overline{BL}$) and the latter lowers V (bit line BL), then both V (bit line BL) and V (bit line $\overline{BL}$) are lowered. Then, because the capacities of the shift register SRn side and dummy cell 55(3) side increase, even if the function of the former is made relatively weaker, the level drop of the bit lines on the H side is remarkably large, so erroneous writing, may occur. The device according to the present invention is concerned with the waveform of FIG. 3(b). In the prior art, a device for enabling more accurate writing from the shift register to the RAM portion has been seeked for.

In the present invention, an active pull-up circuit detects the output of "logic 1" from a shift register to charge the corresponding bit line up to the power source voltage $V_{CC}$. An active pull-down circuit detects the output of "logic 0" from the shift register to charge the corresponding bit line to the ground potential. This enables considerable improvements in the two problems as described in FIG. 3(b). That is, if the level of the bit lines can be controlled by a pull-up and pull-down operation in response to the write-in data, even if the capacity is not that large, it is possible to prevent deteriorating effects by the stored data of the selected cell and to prevent erroneous write-in.

Figure 4:
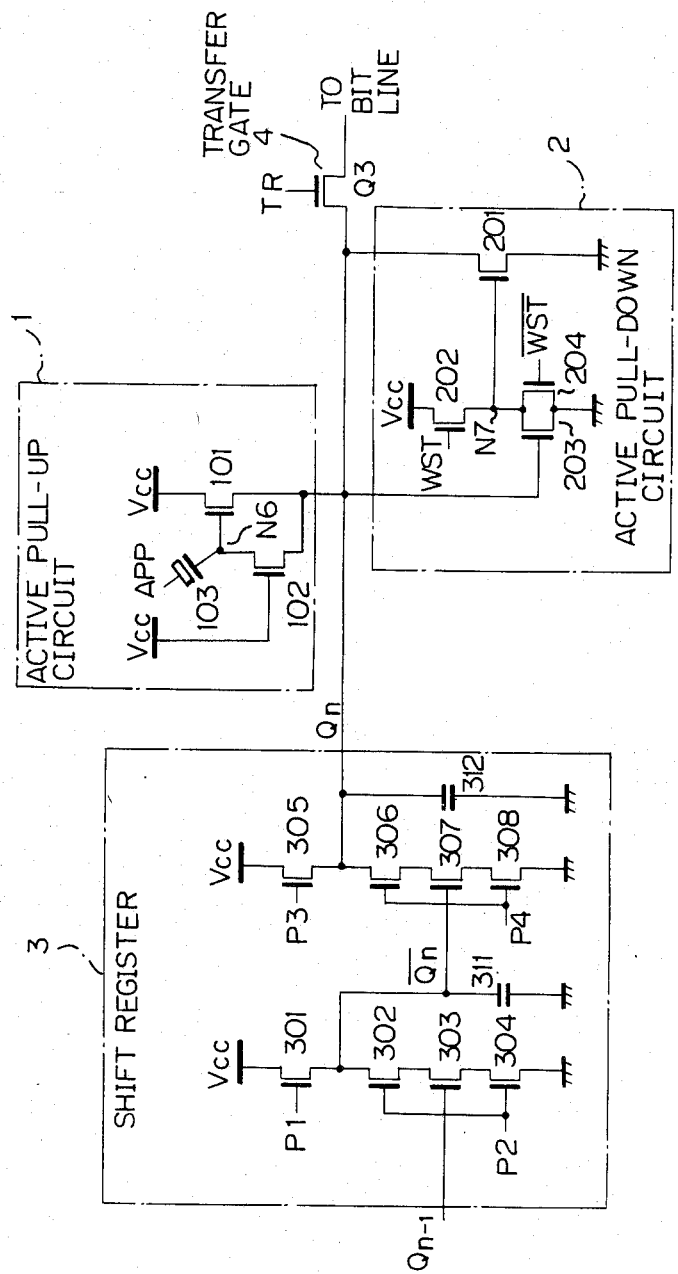
FIG. 4 is a block diagram of a RAM of an embodiment of the present invention.

FIG. 4 is a schematic block diagram of a semiconductor memory device according to an embodiment of the present invention.

In FIG. 4, 1 is an active pull-up circuit for operating, when the n-th stage (SRn) of output Qn of a shift register 3 is "1", to pull up a bit line BL and 2 an active pull-down circuit (APD) for operating, when the n-th stage of output Qn is "0", to pull-down or discharge the bit line BL.

The active pull-up circuit 1 is composed of a transistor 101 for pull-up use and a transistor 102 for charging up the gate (equipotential to a node N6) when Qn="1". When Qn="1", the transistor 102 is off. When a clock APP is applied, the node N6 is pulled up due to the H level of the potential and the transistor 101 turns on to charge up a bit line BL from the power source $V_{CC}$ through a transfer gate 4 and compensate the bit line BL for a shortage of level. When Qn="0", the transistor 102 is made on, so an incoming clock APP does not push up the node N6. The transistor 101 is off, so no pull-up of the bit lines can be performed.

The active pull-down circuit 2 is composed of a transistor 201 for the pull-down and transistors 202 to 204 for controlling the potential of its gate (equipotential to a node N7). The transistor 204 is made on by a clock $\overline{WST}$, which is the H level at resetting, and functions to remove the charge of the node N7 and hold the transistor 201 off. When the transistor 202 is made on by a clock WST, which becomes the H level at the time of parallel transfer (transistor 204 is cut off, when $\overline{WST}$=L), if the transistor 203 is off, the node N7 is charged up to make the transistor 201 on. As a condition for the transistor 203 being off is that Qn="0", when the transistor 201 is on, pull-down of the bit line BL by Qn=0 is promoted.

Use of the active pull-up circuit 1 and active pull-down circuit 2 assists the change to the H or L level of the bit lines BL and $\overline{BL}$ by the data of the shift register 3 and enables reliable write-in even when the capacities of the shift register and dummy cell are not so large.

The shift register 3 is a four-phase ratio-less type and operates dynamically by four-phase clocks P1 to P4. Transistors 301 to 304 constitute a master stage which operates by the clocks P1 and P2. The master stage receiver input $Q_{n-1}$ and outputs an inverted signal $\overline{Qn}$ to charge up or discharge a capacitor 311. Transistors 305 to 308 constitute a slave stage operated by clocks P3 and P4. The slave stage output a $\overline{Qn}$ inverted output Qn to charge up or discharge a capacitor 312. If these capacitors 311 and 312 were small in capacitance, the operation of the shift register could be made faster, but the capacity of the capacitor 312 must be large to enable writing into a RAM due to its relation with the real cells.

As mentioned above, however, provision of the active pull-up circuit 1 and active pull-down circuit 2, enable precise data write even if the capacity is small. The transfer gate Q3 is controlled to turn on simultaneously with when or a little after the active pull-up circuit 1 or active pull-down circuit 2 operates. For instance, when the precharge level of the bit line is the same as the $V_{CC}$ level, it is necessary that the level of a clock TR be higher than $V_{CC}$, in order to make the merits of the active pull-up circuit 1 more effective. This is because, in the active pull-up circuit 1, as the node N6 is boosted higher than $V_{CC}$ (e.g., 7 to 8 V) by a pull-up clock APP through a capacitor 103 of a MOS transistor, if the predetermined value of Qn="1" by the capacitor 312 is 4 V, the value of Qn=1 should be realised to 5 V of $V_{CC}$. Therefore, it is necessary that the clock TR for driving the transfer gate 4 be higher than the value of $V_{CC}$, in order to transmit the value of 5 V in the bit line BL.

Figure 5:
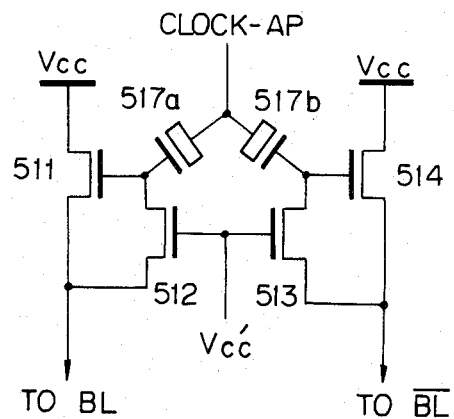
FIG. 5 is a circuit diagram of an active pull-up circuit in a sense amplifier.
Figure 6:
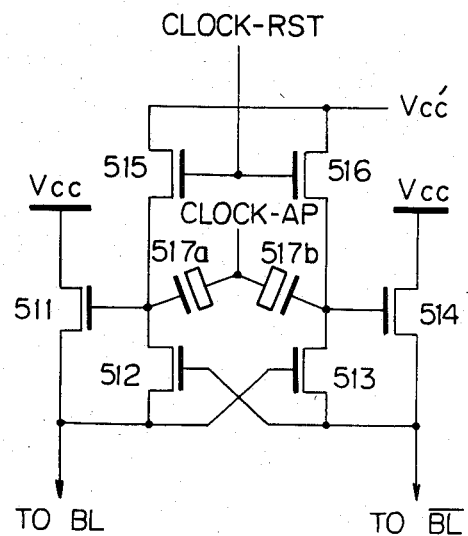
FIG. 6 is a circuit diagram of another active pull-up circuit in a sense amplifier.

FIGS. 5 and 6 show circuits for enhancing the active pull-up capability of the sense amplifier in addition to the above-described active pull-up circuit 1. As shown in FIG. 2, there has conventionally been an active pull-up circuit 51 of the sense amplifier SA, but the pull-up capability is enhanced in FIGS. 5 and 6. Note that $V_{CC}'$ is the same as $V_{CC}$ or another stabilized power source.

Figure 7:
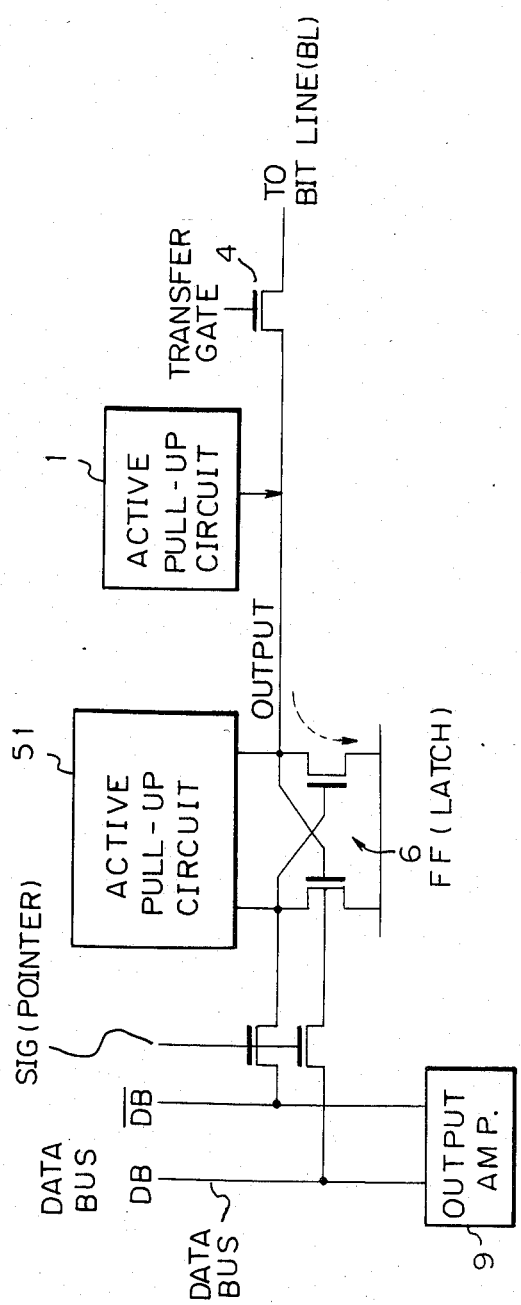
FIG. 7 and FIG. 8 show the general constitution and an overall outline of another embodiment of the present invention.
Figure 8:
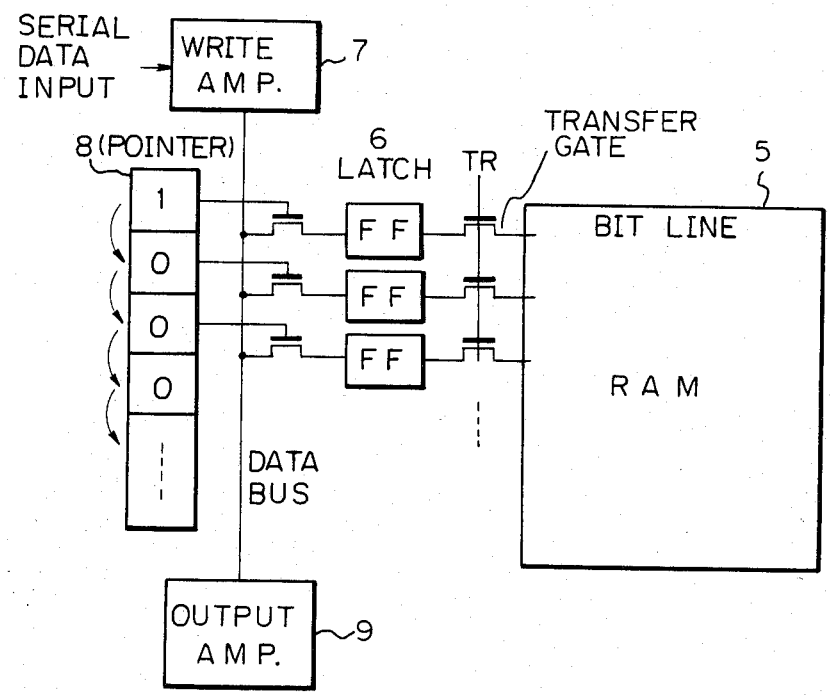

FIGS. 7 and 8 shows an alternative embodiment in accordance with the present invention, wherein a RAM including a latch 6 and pointer 8 is used in place of a shift register SR. First, explaining the embodiment in general with respect to FIG. 8, parallel data is transferred between the RAM 5 and latches 6 (or flip-flop) FF by a word line. No serial data transfer (or shift) occurs between the latches FF's. Instead, one of the latches 6 is selected by the signal from a pointer register 8 storing logic "1" data only in one bit to write the data from a write amplifier 7. Therefore, "1" output SIG(-POINTER) from the pointer register 8 is shifted in sequence and in synchronization therewith. If write data of one word line amount is output to the write amplifier 7 in sequence, the data can be taken in the latch 6 in sequence. Using the data of this latch 6, the data of one word line amount can be written simultaneously into the RAM 5. Reference numeral 9 denotes an output amplifier, from which the data read from the RAM can be output.

That is, the operation of the write amplifier 7 is halted, then a word line of the RAM 5 is selected to read the data of all the memory cells on the word line into the bit lines and input that data into the latches 6. In such a state, if "1" of SIG(POINTER) is shifted in sequence, the data of the groups of memory cells can be fetched out from the output amplifier 9 serially in sequence. In the RAM, as shown in FIG. 7, the active pull-up circuit 51 is connected to the latch FF. When $Q_n=1$, the bit line BL is pulled up to $V_{CC}$. On the other hand, a pull-down operation is carried out, as shown by the broken line, through a transistor 4 of the latch 6, FF, so it is unnecessary to provide an active pull-down circuit 2.

Figure 9:
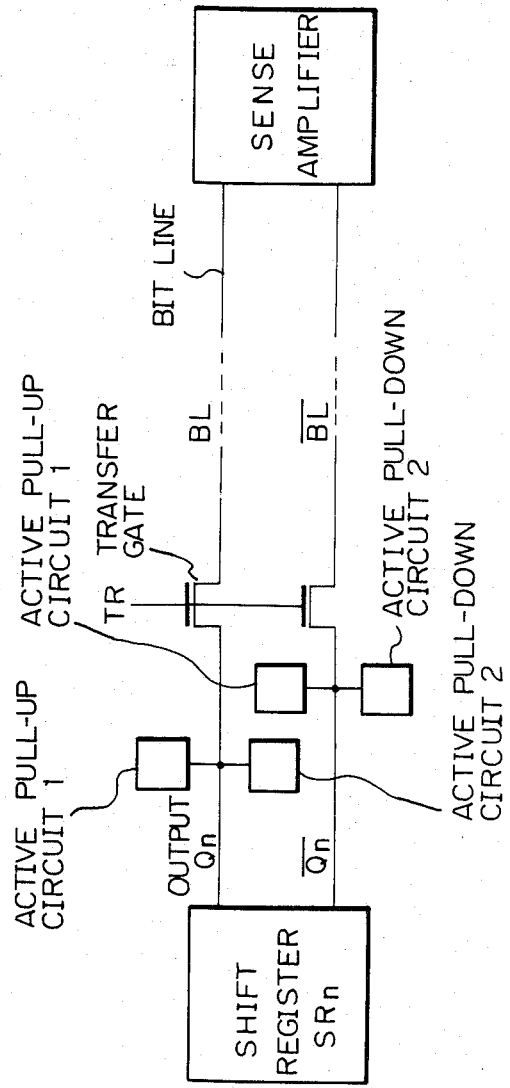
FIGS. 9 and 10 show the general constitution of an still another embodiment of the present invention.
Figure 10:
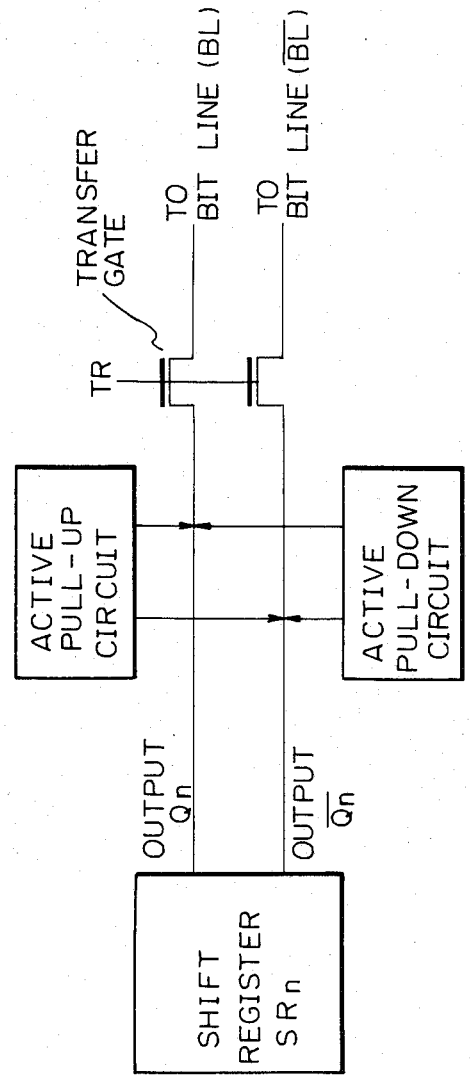

FIGS. 9 and 10 show a further alternative embodiment in accordance with the present invention, applicable to a RAM of the back-to-back bit line type. In this case, the bit lines BL and $\overline{BL}$ can be driven by the stages of outputs $Q_n$ and $\overline{Q_n}$ in the shift register SR, so the dummy cell DC for transfer use may be omitted.

The advantage of the device of the invention is that it is not necessary that the RAM portion be operated in a different mode from normal operation when transferring parallel data and that precise write-in is possible with ease even with a smaller capacity of the output node of a serial/parallel data transfer circuit such as a shift register.

While this invention has been described with reference to illustrative embodiments, this description is not intended to be construed in a limiting sense. The appended claims cover any such modifications or embodiments as fall within the scope of the invention.

I claim:

1. A semiconductor memory device comprising:
    a random access memory cell array including a plurality of memory cells, word lines, and bit lines, each of said memory cell being connected to one of said word lines and to one of said bit lines;
    series/parallel data transfer means capable of parallel transfer of data of one word line amount of said random access memory as well as series transfer of said data, said series/parallel data transfer means having a plurality of stages;
    transfer gate means inserted between bit lines of said random access memory cell array and said series/parallel data transfer means for carrying out parallel transfer of data, parallel output data from said stages of said series/parallel data transfer means being simultaneously written in a group of memory cells of selected word lines of said random access memory cell array by turning-on of said transfer gate means and selection of a word line; and
    a plurality of active pull-up circuit means, operatively connected to said bit lines and to receive said parallel data, respectively, each for charging the associated bit line of said random access memory cell array when corresponding one of said parallel output data from the associated stage of said series/parallel data transfer means is logic "1".

2. A semiconductor memory device of claim 1, further comprising: a plurality of active pull-down circuit means, operatively connected to said bit lines and to receive said parallel data, respectively, each for discharging the associated bit line of said random access memory cell array when corresponding one of said parallel output data from the associated stage of said series/parallel data transfer means is logic "0".

* * * * *

UNITED STATES PATENT AND TRADEMARK OFFICE
CERTIFICATE OF CORRECTION

PATENT NO. : 4,616,343
DATED : Oct. 7, 1986
INVENTOR(S) : Juni OGAWA

It is certified that error appears in the above-identified patent and that said Letters Patent is hereby corrected as shown below:

Col. 1, line 31, "the" should be --they--.

Col. 2, line 33, "ensuring" should be --ensuing--.

Col. 3, line 59 "(work" should be --(word--.

Col. 5, line 10 "BL" (second occurrence) should be --$\overline{BL}$--.

Col. 6, line 10, "receiver" should be --receives--;

line 13, "output" (first occurrence) should be --outputs--;

line 20, before "provision" insert --the--;

line 22, "enable" should be --enables--;

line 24, delete "when";

line 46, "shows" should be --show--;

line 51, "latches" should be --latch--;

lines 51-52, "flip-flop) FF" should be --flip-flop FF)--;

line 53, "FF's." should be --(FF's).--;

line 55, "SIG (-" should be --SIG--;

UNITED STATES PATENT AND TRADEMARK OFFICE
CERTIFICATE OF CORRECTION

PATENT NO. : 4,616,343

DATED : Oct. 7, 1986

INVENTOR(S) : Juni OGAWA

Page 2 of 2

It is certified that error appears in the above-identified patent and that said Letters Patent is hereby corrected as shown below:

line 56, "POINTER)" should be --(POINTER)--.

Col. 7, line 9, ", FF," should be --(FF)--.

Col. 8, line 1, "cell" should be --cells--;

line 18, delete "and";

line 21, after "when" insert --a--.

In the Figures:

Fig. 3(b), the lower designation "V(BIT LINE BL)" should be --V(BIT LINE $\overline{BL}$)-- and should be understood to identify the lower of the generally horizontally extending curves, as in Fig.'s 3(a) and 3(c).

Signed and Sealed this

Seventh Day of April, 1987

Attest:

DONALD J. QUIGG

*Attesting Officer*    *Commissioner of Patents and Trademarks*